(12) United States Patent
Dai et al.

(10) Patent No.: US 10,549,551 B2
(45) Date of Patent: Feb. 4, 2020

(54) DRYING DEVICE AND DRYING METHOD USING THE SAME

(71) Applicant: BOE TECHNOLOGY GROUP CO., LTD., Beijing (CN)

(72) Inventors: Qing Dai, Beijing (CN); Ze Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 662 days.

(21) Appl. No.: 15/022,009

(22) PCT Filed: Jul. 16, 2015

(86) PCT No.: PCT/CN2015/084216
§ 371 (c)(1),
(2) Date: Mar. 15, 2016

(87) PCT Pub. No.: WO2016/165221
PCT Pub. Date: Oct. 20, 2016

(65) Prior Publication Data
US 2017/0057249 A1    Mar. 2, 2017

(30) Foreign Application Priority Data
Apr. 13, 2015  (CN) .......................... 2015 1 0172926

(51) Int. Cl.
*B41J 11/00*  (2006.01)
*F26B 25/14*  (2006.01)

(52) U.S. Cl.
CPC ............. *B41J 11/002* (2013.01); *F26B 25/14* (2013.01)

(58) Field of Classification Search
CPC ............... F26B 25/14; H01L 21/67028; H01L 21/6875; H01L 21/67748; H01L 21/6719; H01L 21/67178; H01L 21/67109; H01L 21/67051; H01L 21/67034; H01L 21/67126; B41J 11/002
See application file for complete search history.

(56) References Cited

U.S. PATENT DOCUMENTS

| | | | |
|---|---|---|---|
| 2,279,590 A * | 4/1942 | Haworth | ............... B03B 4/02 209/466 |
| 2008/0008837 A1* | 1/2008 | Shiba | ............... H01L 21/67109 427/372.2 |
| 2014/0041805 A1* | 2/2014 | Kuga | ............... H01J 37/02 156/345.33 |

FOREIGN PATENT DOCUMENTS

| CN | 1251629 A | 4/2000 |
|---|---|---|
| CN | 1794099 A | 6/2006 |
| CN | 101762985 A | 6/2010 |

(Continued)

OTHER PUBLICATIONS

ISR of international application No. PCT/CN2015/084216 dated Jan. 20, 2016.

(Continued)

*Primary Examiner* — Jessica Yuen
(74) *Attorney, Agent, or Firm* — Nath, Goldberg & Meyer; Joshua B. Goldberg

(57) ABSTRACT

The present invention provides a drying device and a drying method using the same. The drying device comprises a drying portion and a carrying portion, the carrying portion is used for carrying a substrate formed with a film layer to be dried, and the drying portion is arranged to face the film layer to be dried so as to dry the film layer to be dried.

11 Claims, 3 Drawing Sheets

(56) References Cited

FOREIGN PATENT DOCUMENTS

| | | | |
|---|---|---|---|
| CN | 202067075 U | | 12/2011 |
| CN | 202098100 U | | 1/2012 |
| CN | 202169763 U | | 3/2012 |
| CN | 102632700 A | | 8/2012 |
| CN | 103760696 A | | 4/2014 |
| DE | 3229903 A1 | | 2/1984 |
| JP | s60964 A | | 1/1985 |
| JP | 2002166667 A | | 6/2002 |
| JP | 2002210920 A | | 7/2002 |
| JP | 3170799 U | * | 9/2011 |

OTHER PUBLICATIONS

Notification of the First Office Action dated Sep. 29, 2016 corresponding to Chinese application No. 201510172926.3.

* cited by examiner

DRYING DEVICE AND DRYING METHOD USING THE SAME

FIELD OF THE INVENTION

The present invention relates to the field of display technology, and particularly elates to a drying device and a drying method using the same.

BACKGROUND OF THE INVENTION

In a preparation of organic light-emitting diode (OLED) devices, organic functional layer films are usually formed by an ink-jet printing method or the like, and in a preparation of liquid crystal display (LCD) devices, color filters are usually formed by the ink-jet printing method or the like. A common characteristic of various wet processes including ink-jet printing for forming a film lies in that: the excess solvent needs to be removed from the film by a subsequent drying process. The process for forming a dried film by removing the solvent will influence uniformity of the formed film. For photoelectric display devices, an uniformity of the dried film greatly influences the service life and the display effect of the display devices.

FIG. 1 schematically shows a top view of a display substrate including a dried film. As shown in FIG. 1, after the solvent ink, which contains organic functional material, is jetted onto a display area 41 of the display substrate 4, a process, in which the solvent is allowed to naturally volatilize at atmospheric pressure or is removed at a pressure lower than atmospheric pressure, is required. The solvent ink jetted onto the display area 41 is dispersed in a pixel area in a very small ink droplet form and has a large surface area, so that the natural volatilization rate of the solvent ink is high. The natural volatilization rate of a portion of the solvent ink located in an edge area 411 of the display area 41 is higher than that in a central area 412 of the display area 41.

FIG. 2 is a sectional view of the display substrate 4 in FIG. 1 taken along a cutting line 5. FIG. 2 shows pixel separation structures 42 and an organic film 43 after being resulting in non-uniform film formed after being dried (coffee-ring effect), in the pixel area of the edge area 411 of the display area. However, the film formed after being dried, in the central area 412 far from the edge area 411, has better uniformity. There are many reasons for the formation of the non-uniform film after naturally volatilizing and dried, for example, solvent characteristics composition ratio and vapor pressure, etc.), material of the pixel separation structure 42, equipment for implementation of the drying process, etc. In some cases, the non-uniform film will result in bad display of concentric circles extending from the center to the periphery, as shown in FIG. 1, after the display device is powered on.

In the existing production process, the solvent in the film formed by the wet process is usually removed in a vacuum furnace at a pressure lower than atmospheric pressure. An exhaust port of the current vacuum equipment is usually arranged at the corner of the furnace, easily resulting in non-uniform airflow distribution in an air exhausting process under reduced pressure, and the differences between the solvent volatilization rates in different areas of the film are changed with respect to the naturally volatilizing and drying condition, resulting in that non-uniformity of the dried film is also changed.

In a word, it is difficult to avoid non-uniform surface of the dried film, whether the solvent is removed from the film by the naturally volatilizing and drying method, or by using the conventional vacuum drying equipment. Therefore, how to reduce or avoid the non-uniform surface after drying the organic film formed by the wet process has become a difficult problem to be solved urgently.

SUMMARY OF THE INVENTION

The present invention provides, in view of the above technical problems in the prior art, a drying device and a drying method. The drying device allows the solvent in different areas of the film layer to be dried to have substantially the same volatilization rates during a drying process, so that the film layer to be dried has an even surface after a drying process, and then the service life and the display effect of the display device including the dried film layer are improved.

According to one aspect of the present invention, there is provided a drying device, including a drying portion and a carrying portion. The carrying portion is used for carrying a substrate formed with a film layer to be dried. The drying portion is arranged to face the film layer to be dried so as to dry the film layer to be dried.

According to an exemplary embodiment, the drying portion may include an exhaust cover, a partition plate and an exhaust mechanism. The exhaust cover includes a first opening arranged to face the film layer to be dried and a second opening arranged to face away from the film layer to be dried. The exhaust cover is connected to the exhaust mechanism through the second opening. The partition plate is provided with a plurality of holes and covers the first opening of the exhaust cover. The exhaust mechanism is used for exhausting air.

According to an exemplary embodiment, the exhaust cover may has a hollow cone shape, and an area of the second opening is smaller than that of the first opening, and an orthographic projection of the second opening on the partition plate falls within a central area of the partition plate.

According to an exemplary embodiment, the partition plate may have shape and size corresponding to the film layer to be dried, and may be arranged to be parallel to the film layer to be dried.

According to an exemplary embodiment, the partition plate may be divided into a plurality of areas, and the plurality of holes provided on the partition plate may have a same size and shape. A density of holes in each of the plurality of areas is inversely proportional to a natural drying rate of a corresponding area of the film layer to be dried.

According to an exemplary embodiment, the partition plate may be divided into a plurality of areas, and the plurality of holes provided on the partition plate may have a same shape and different sizes. The size of holes in each of the plurality of areas is inversely proportional to a natural drying rate of the corresponding area of the film layer to be dried.

According to an exemplary embodiment, the plurality of holes arranged on the partition plate may have a same size and shape, and be uniformly distributed on the partition plate. The partition plate may also be provided with hole plugs respectively corresponding to the plurality of holes, and when the hole plugs are inserted into the holes, the holes are blocked.

According to an exemplary embodiment, the drying portion may also include a solvent adding mechanism arranged on a periphery of the first opening and used for adding a solvent adopted for forming the film layer to be dried into an edge area of the film layer to be dried, and the solvent is in a volatile state.

According to an exemplary embodiment, the solvent adding mechanism may include a solvent trench and a volatilizing structure. The solvent trench is used for accommodating a non-volatilized solvent. The volatilizing structure is used for volatilizing the solvent in the solvent trench to form the solvent in the volatile state, and is used for adding the solvent in the volatile state into the edge area of the film layer to be dried.

According to an exemplary embodiment, the carrying portion may include a carrier plate and a fence arranged at an edge of the carrier plate. The carrier plate is used for carrying the substrate formed with the film layer to be dried, and a height of the fence is larger than that of an upper surface of the film layer to be dried.

According to an exemplary embodiment, a distance from the top of the fence to the upper surface of the film layer to be dried may be larger than 10 cm.

According to an exemplary embodiment, the carrier plate may have a same shape as the first opening, and an area of the carrier plate is larger than that of the first opening.

According to another aspect of the present invention, there is provided a drying method using the drying device according to the present invention, including: placing the substrate formed with the film layer to be dried on the carrying portion of the drying device; adjusting the drying portion of the drying device to face the film layer to be dried; and performing drying process on the film layer to be dried through the drying portion of the drying device.

According to an exemplary embodiment, the drying portion may include exhaust cover, a partition plate and an exhaust mechanism. The exhaust cover includes a first opening arranged to face the film layer to be dried, and a second opening arranged to face away from the film layer to be dried. The exhaust cover is connected to the exhaust mechanism through the second opening. The partition plate is provided with a plurality of holes and covers the first opening of the exhaust cover. The exhaust mechanism is used for exhausting air. The carrying portion may include a carrier plate and a fence arranged at an edge of the carrier plate. The carrier plate is used for carrying the substrate formed with the film layer to be dried, and a height of the fence is larger than that of an upper surface of the film layer to be dried. The step of adjusting the drying portion of the drying device to face the film layer to be dried may include: lowering the exhaust cover of the drying portion or lifting the carrier plate of the carrying portion so that a lower edge of the first opening of the exhaust cover is lower than the top of the fence of the carrying portion, and a distance between a lower surface of the partition plate and the upper surface of the film layer to be dried is in the range of 1 mm to 10 cm.

According to the drying device and the drying method in the embodiments of the present invention, the volatilization rates of the solvent in different areas of the film layer to be dried are substantially the same during the drying process, so that the film layer to be dried has a uniform surface after a drying process, and further the service life and the display effect of the display device including the dried film layer are improved.

BRIEF DESCRIPTION OF THE DRAWINGS

The accompanying drawings are used for providing a further understanding of the present invention, constitute a part of the specification, and are used for explaining the present invention together with following specific embodiments but not for limiting the present invention, in which.

DESCRIPTION OF THE PREFERRED EMBODIMENT

To make those skilled in the art understand the technical solutions of the present invention better, a drying device and a drying method using the same provided by the present invention will be further described in detail as below with reference to the accompanying drawings and specific implementations.

Figure 1:
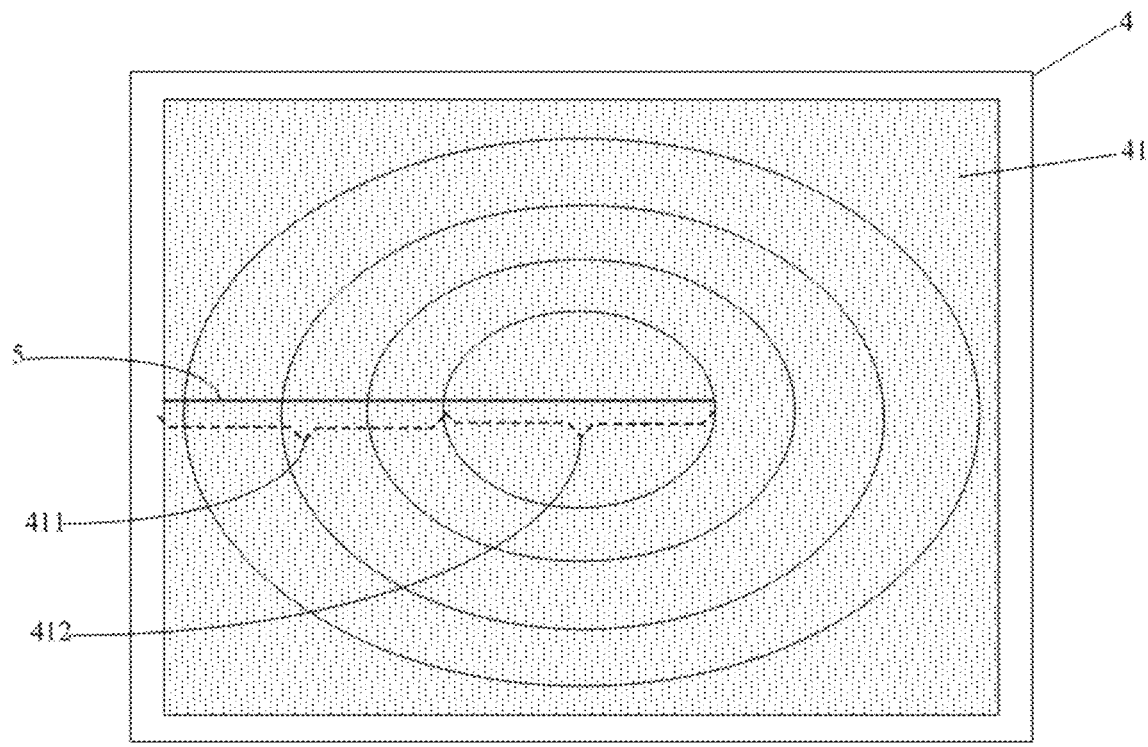
FIG. 1 schematically shows a top view of a display substrate including a dried film in prior art.
Figure 2:
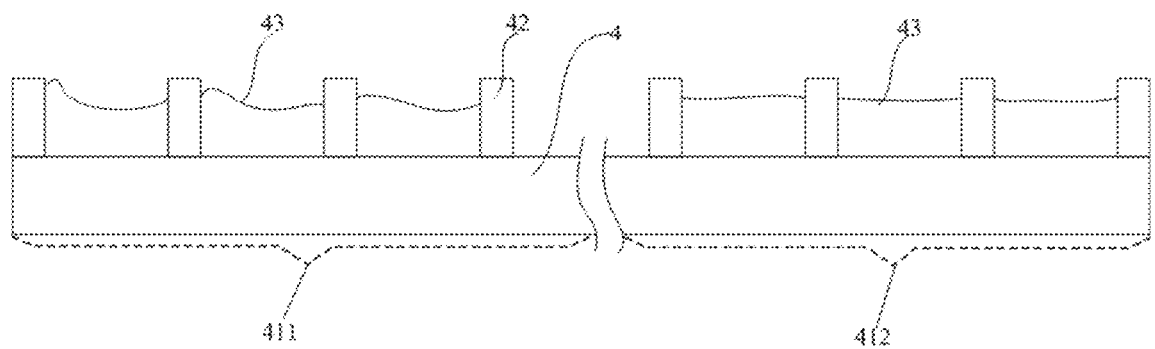
FIG. 2 is a sectional view of a display substrate in FIG. 1 taken along a cutting line 5.
Figure 3:
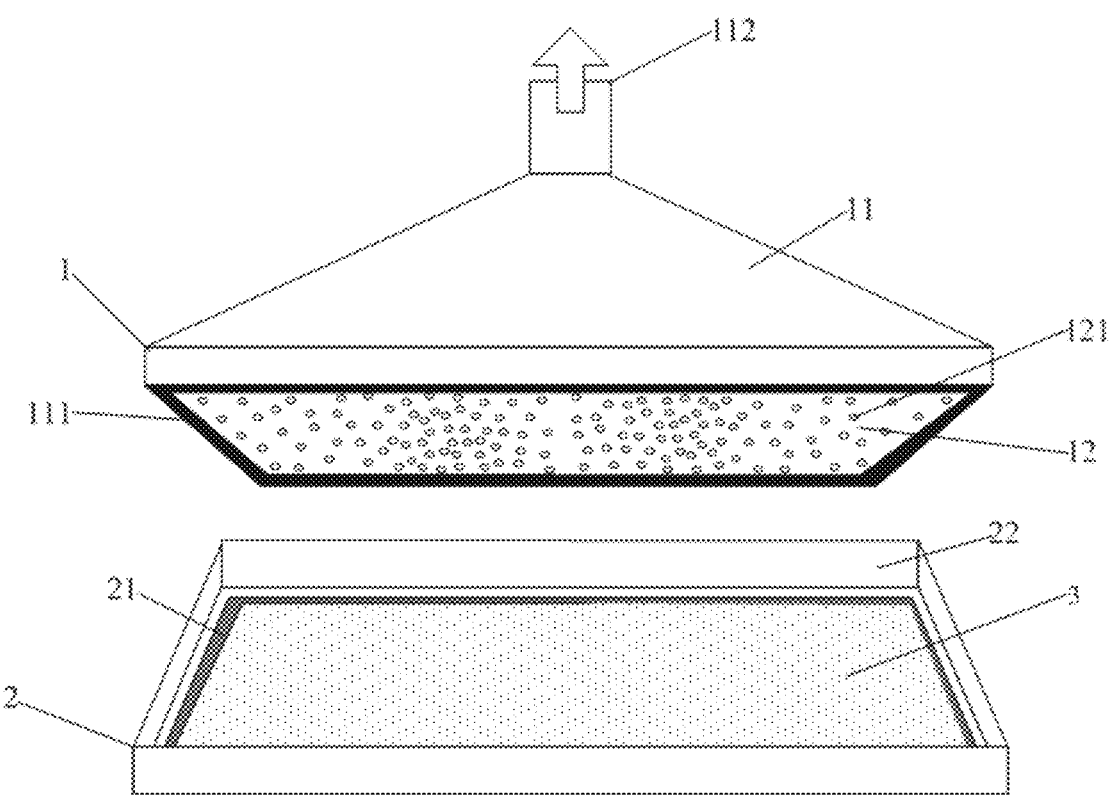
FIG. 3 is a schematic diagram of a structure of a drying device according to an embodiment of the present invention.

FIG. 3 is a structure diagram of a drying device according to an embodiment of the present invention.

As shown in FIG. 3, the drying device according to an exemplary embodiment includes a drying portion 1 and a carrying portion 2. The carrying portion 2 is configured to carry a substrate formed with a film layer 3 to be dried. The drying portion 1 is arranged to face the film layer 3 to be dried and thus to dry the film layer 3 to be dried.

As shown in FIG. 3, the drying portion 1 includes an exhaust cover 11, a partition plate 12 and an exhaust mechanism (not shown in the figure). The exhaust cover 11 includes a first opening 111 arranged to face the film layer 3 to be dried and a second opening 112 arranged to face away from the film layer 3 to be dried. The exhaust cover 11 is connected to the exhaust mechanism through the second opening 112. The partition plate 12 is provided with a plurality of holes 121 therein and covers the first opening 111 of the exhaust cover 11. The exhaust mechanism is configured to exhaust air. That is, the drying portion 1 volatilizes the solvent in the film layer 3 to be dried by exhausting air from a surface of the film layer 3 to be dried. In this way, the volatilization rate of the solvent may be increased, thus improving efficiency.

The exhaust cover 11 may be a hollow cone, and the area of the second opening 112 is smaller than that of the first opening 111, and the orthographic projection of the second opening 112 on the partition plate 12 falls within the central area of the partition plate 12. That is, the second opening 112 is located right above the first opening 111. Such arrangement can enable the air flow from the first opening 111 to the second opening 112 to be uniform everywhere during air exhausting in the exhaust cover 11, as a result, the air can be uniformly exhausted from different areas on the surface of the film layer 3 to be dried, and it is thus ensured that the solvent in different areas on the surface of the film layer 3 to be dried has substantially the same volatilization rate.

According to an exemplary embodiment, the partition plate 12 may be of shape and size corresponding to the film layer 3 to be dried, and configured to be parallel to the film layer 3 to be dried.

According to an exemplary embodiment, the partition plate 12 may be divided into a plurality of areas, and a plurality of holes 121 arranged on the partition plate 12 may be of the same size and shape. The density of the holes in each of the plurality of areas is inversely proportional to a natural drying rate of a corresponding area of the film layer 3 to be dried.

Figure 4:
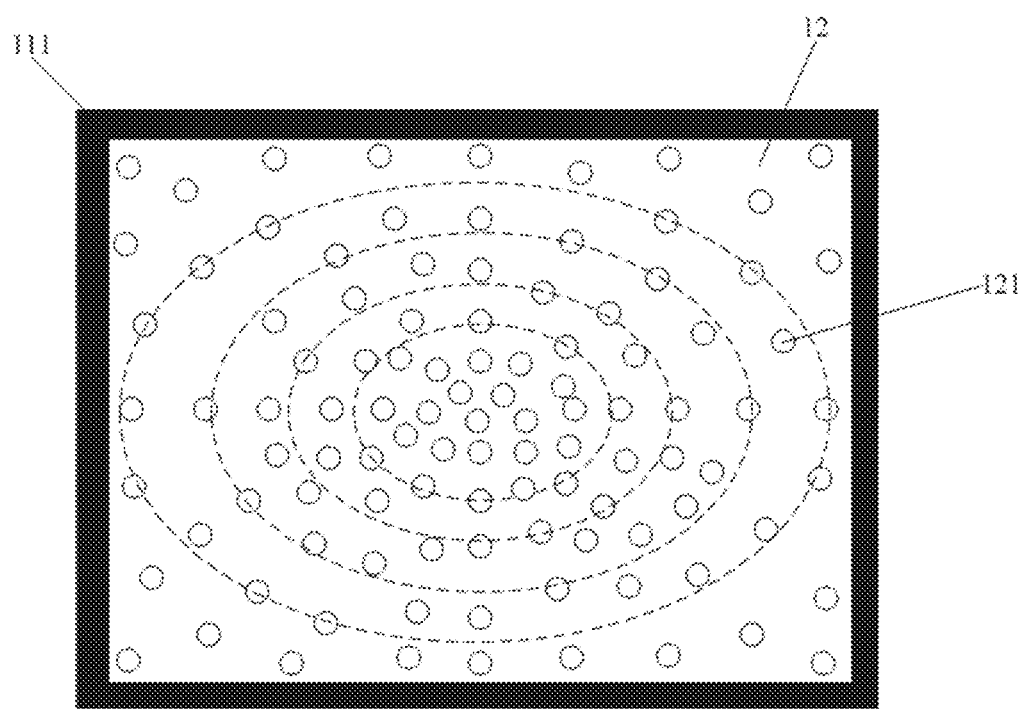
FIG. 4 is a schematic diagram of a structure of a partition plate in FIG. 3.

FIG. 4 is a schematic diagram of a structure of the partition plate 12 in FIG. 3. As shown in FIG. 4, the plurality of holes 121 may be of the same size and shape, and the densities of the holes 121 in different areas of the partition plate 12 are inversely proportional to the natural drying rates of the corresponding areas of the film layer 3 to be dried.

The natural drying rate refers to the volatilization rate of the solvent in the film layer to be dried in the natural environment. Because the natural drying rates in different areas of the film layer 3 to be dried may be different from each other, the densities of the holes in the corresponding areas of the partition plate 12 may be controlled, such that the drying portion 1 can carry out air exhaust operation in different degrees according to the natural drying rates in different areas of the film layer 3 to be dried. A smaller exhaust volume is provided for the area with a larger smaller natural drying rate, so that the volatilization rates of the solvent in different areas of the film layer 3 to be dried are substantially the same.

According to an exemplary embodiment, the partition plate 12 may be divided into a plurality of areas, and a plurality of holes 121 arranged on the partition plate 12 may be of the same shape and different sizes. The size of the holes in each of the plurality of areas is inversely proportional to the natural drying rate of the corresponding area of the film layer 3 to be dried. According to an exemplary embodiment, a smaller exhaust volume is provided for the area with a larger natural drying rate, while a larger exhaust volume is provided for the area with a smaller natural drying rate, so that the volatilization rates of the solvent in different areas of the film layer 3 to be dried are substantially the same.

According to an exemplary embodiment, the plurality of holes 121 arranged on the partition plate 12 may be of the same size and shape, and are uniformly distributed on the partition plate 12. The partition plate 12 may also be provided with hole plugs (not shown in the figure) corresponding to the plurality of holes 121, and when the hole plugs are inserted into the holes 121, the holes 121 are blocked.

According to the embodiment, the hole plugs may be used to adjust the air exhaust volumes in different areas of the partition plate 12.

It needs to be noted that, the partition plate 12 is detachably mounted on the first opening 111. Therefore, for different film layers 3 to be dried, the partition plates 12 with different hole arrangements (different hole densities, different hole sizes or different arrangements of hole plugs) may be mounted as required.

Figure 5:
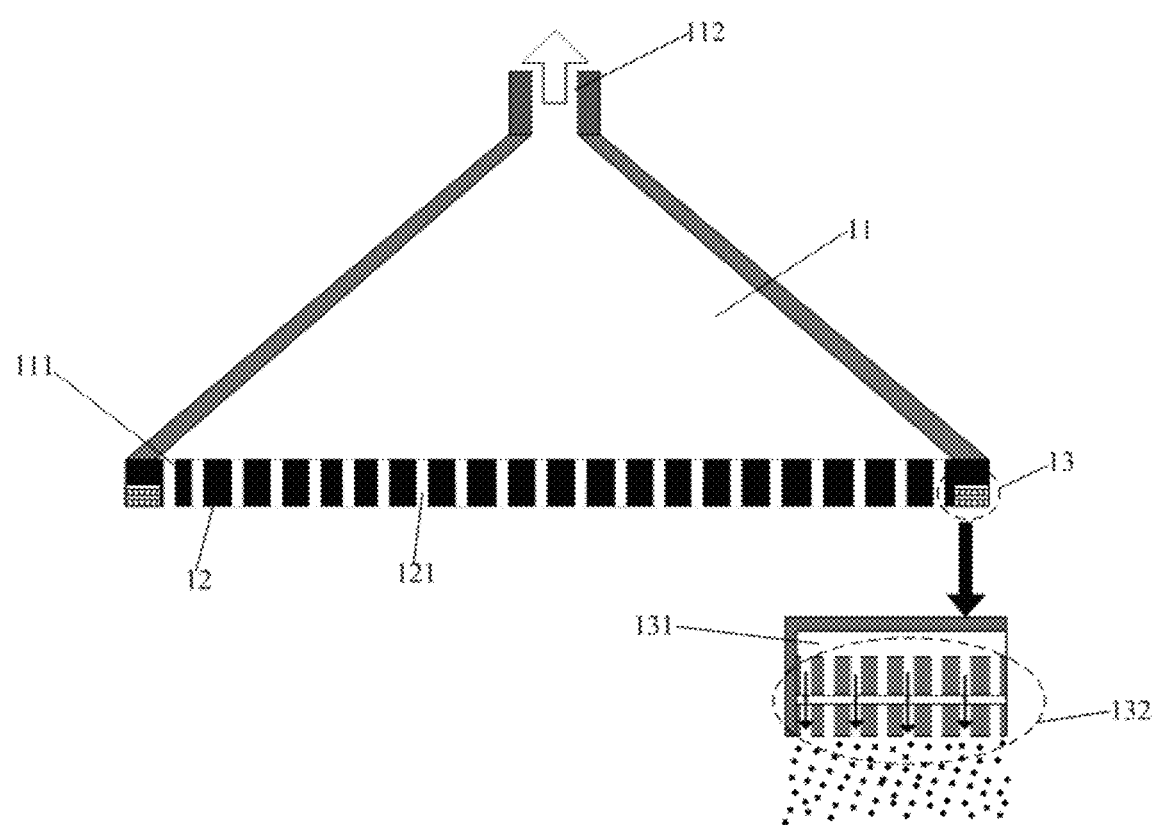
FIG. 5 is a sectional view of a drying portion in FIG. 3.

FIG. 5 is a sectional view of the drying portion 1 in FIG. 3.

Usually, the natural drying rate of the film layer 3 to be dried in the edge area is greater than that in the central area. As shown in FIG. 5, the drying portion 1 may also include a solvent adding mechanism 13 which is arranged on the periphery of the first opening 111 and configured to add the solvent adopted for forming the film layer 3 to be dried into the edge area of the film layer 3 to be dried, and the solvent is in a volatile state.

In some cases, even though the air exhaust operation is carried out by using the drying portion 1 including the partition plate 12 with a specific hole arrangement according to the aforementioned embodiments, the volatilization rate of the solvent in the edge area of the film layer 3 to be dried is still faster than that in the central area thereof. The solvent in a volatile state is added to the edge area of the film layer 3 to be dried through the solvent adding mechanism 13, so that the volatilization rates of the solvent in the edge area and the central area of the film layer 3 to be dried can be substantially the same, and further the uniformity of the surface of the dried film layer is ensured.

According to an exemplary embodiment, the solvent adding mechanism 13 may include a solvent trench 131 and a volatilizing structure 132. The solvent trench 131 is configured to accommodate the non-volatilized solvent. The volatilizing structure 132 is configured to allow the solvent in the solvent trench 131 to volatilize to become solvent in a volatile state, and add the solvent in the volatile state into the edge area of the film layer 3 to be dried.

According to an exemplary embodiment, the volatilizing structure 132 may be a grid-shaped barrier, and gauze or non-woven fabric is arranged in a breathable grid hole of the barrier. The barrier may serve as the bottom of the solvent trench 131 and is used for supporting the solvent in the solvent trench 131. The gauze or non-woven fabric arranged in the breathable grid hole of the barrier may only allow passage of the solvent in the volatile state after natural volatilization. Hence, the solvent in the solvent trench 131 naturally volatilizes, and diffuses towards the edge area of the film layer 3 to be dried after passing through the gauze or non-woven fabric, and as a result, an atmosphere with solvent in a volatile state is formed above the edge areas of the film layer 3 to be dried.

It needs to be noted that, the volatilizing structure 132 may be any equipment, such as a humidifier, which turns the non-volatilized solvent into the volatilized solvent. In addition, the volatilizing structure 132 may also include the gauze or non-woven fabric only.

Returning to FIG. 3, the carrying portion 2 may include a carrier plate 21 and a fence 22 arranged at the edges of the carrier plate 21. The carrier plate 21 is configured to carry the substrate formed with the film layer 3 to be dried, and the height of the fence 22 is larger than that of an upper surface of the film layer 3 to be dried.

According to an exemplary embodiment, a distance from the top of the fence 22 to the upper surface of the film layer 3 to be dried may be larger than 10 cm. The carrier plate 21 may be of the same shape as the first opening 111, and the area of the carrier plate 21 may be larger than that of the first opening 111, so that the first opening 111 is embedded in the fence 22. When the first opening 111 is embedded in the fence 22, the distance between the partition plate 12 and the film layer 3 to be dried may be reduced, and the edges of the partition plate 12 also sink into the fence 22 to reduce ventilation of the solvent in the edge area of the film layer 3 to be dried towards outer space, thereby facilitating adjusting the volatilization rate of the solvent in the edge area of the film layer 3 to be dried to be substantially the same as that in the central area thereof.

In the drying process by using the drying device according to the embodiments of the present invention, first, the substrate formed with the film layer to be dried is placed on the carrying portion of the drying device; then the drying portion of the drying device is adjusted to face the film layer to be dried; and then a drying process is performed on the film layer to be dried through the drying portion of the drying device.

In the step of adjusting the drying portion of the drying device to face the film layer to be dried, the exhaust cover of the drying portion nay be lowered or the carrier plate of the carrying portion may be lifted, so that the lower edge of the first opening of the exhaust cover is lower than the top of the fence of the carrying portion (that is, the first opening is embedded in the fence), and a distance between the lower surface of the partition plate and the upper surface of the film layer to be dried is in the range of 1 mm to 10 cm. When the distance between the lower surface of the partition plate and the upper surface of the film layer to be dried is set in the above range, it is favorable for adjusting the volatilization rate of the solvent in the edge area of the film layer to be dried to be substantially the same as that in the central area thereof, and further uniformity of the surface of the dried film layer is ensured.

It may be understood that, the implementations as described above are merely exemplary implementations used for explaining the principle of the present invention, and the present invention is not limited thereto. For a person of ordinary skill in the art, various variations and improvements may be made without departing from the spirit and essence of the present invention, and those variations and improvements shall be regarded as falling into the protection scope of the present invention.

The invention claimed is:

1. A drying device, comprising a drying portion and a carrying portion, the carrying portion is used for carrying a substrate formed with a film layer to be dried, and the drying portion is arranged to face the film layer to be dried so as to dry the film layer to be dried,
   wherein the drying portion and the carrying portion are capable of moving with respect to each other in a vertical direction,
   the drying portion comprises an exhaust cover, a partition plate, an exhaust mechanism and a solvent adding mechanism,
   the exhaust cover comprises a first opening arranged to face the film layer to be dried and a second opening arranged to face away from the film layer to be dried, and is connected to the exhaust mechanism through the second opening,
   the partition plate is provided with a plurality of holes and covers the first opening of the exhaust cover,
   the exhaust mechanism is used for exhausting air, and
   the solvent adding mechanism is arranged on a periphery of the first opening and used for adding a solvent adopted for forming the film layer to be dried into an edge area of the film layer to be dried, and the solvent is in a volatile state,
   the carrying portion comprises a carrier plate and a fence arranged at an edge of the carrier plate,
      the carrier plate is used for carrying the substrate formed with the film layer to be dried, and a height of the fence with respective to the carrier plate is larger than that of an upper surface of the film layer to be dried when the substrate is carried by the carrier plate.

2. The drying device according to claim 1, wherein the exhaust cover has a hollow cone shape, an area of the second opening is smaller than that of the first opening, and an orthographic projection of the second opening on the partition plate falls within a central area of the partition plate.

3. The drying device according to claim 2, wherein the partition plate has shape and size corresponding to the film layer to be dried, and is arranged to be parallel to the film layer to be dried.

4. The drying device according to claim 1, wherein the partition plate is divided into a plurality of areas, and the plurality of holes provided on the partition plate have a same size and shape, and
   a density of holes in each of the plurality of areas is inversely proportional to a natural drying rate of a corresponding area of the film layer to be dried.

5. The drying device according to claim 1, wherein the partition plate is divided into a plurality of areas, and the plurality of holes provided on the partition plate have a same shape and different sizes, and
   the size of the holes in each of the plurality of areas is inversely proportional to a natural drying rate of a corresponding area of the film layer to be dried.

6. The drying device according to claim 1, wherein the plurality of holes provided on the partition plate have a same size and shape and are uniformly distributed on the partition plate, and
   the partition plate is also provided with hole plugs respectively corresponding to the plurality of holes, wherein when the hole plugs are inserted into the holes, the holes are blocked.

7. The drying device according to claim 1, wherein the solvent adding mechanism comprises a solvent trench and a volatilizing structure,
   the solvent trench is used for accommodating a non-volatilized solvent, and
   the volatilizing structure is used for volatilizing the solvent in the solvent trench to form the solvent in the volatile state, and is used for adding the solvent in the volatile state into the edge area of the film layer to be dried.

8. The drying device according to claim 1, wherein a distance from the top of the fence to the upper surface of the film layer to be dried is larger than 10 cm.

9. The drying device according to claim 8, wherein the carrier plate has a same shape as the first opening, and an area of the carrier plate is larger than that of the first opening.

10. A drying method using the drying device according to claim 1, comprising:
    placing the substrate formed with the film layer to be dried on the carrying portion of the drying device;
    adjusting the drying portion of the drying device to face the film layer to be dried; and
    performing drying process on the film layer to be dried through the drying portion of the drying device.

11. The drying method according to claim 10,
    wherein, adjusting the drying portion of the drying device to face the film layer to be dried comprises: lowering the exhaust cover of the drying portion or lifting the carrier plate of the carrying portion so that a lower edge of the first opening of the exhaust cover is lower than the top of the fence of the carrying portion, and a distance between a lower surface of the partition plate and the upper surface of the film layer to be dried is in the range of 1 mm to 10 cm.

* * * * *